United States Patent [19]

Hargis

[11] 4,271,426
[45] Jun. 2, 1981

[54] LEADED MOUNTING AND CONNECTOR UNIT FOR AN ELECTRONIC DEVICE

[75] Inventor: Billy M. Hargis, Hugo, Minn.

[73] Assignee: Minnesota Mining and Manufacturing Company, St. Paul, Minn.

[21] Appl. No.: 52,601

[22] Filed: Jul. 2, 1979

Related U.S. Application Data

[63] Continuation-in-part of Ser. No. 932,609, Aug. 10, 1978.

[51] Int. Cl.³ .................... H01L 23/02; H01L 23/12; H01L 39/02
[52] U.S. Cl. ........................................ 357/74; 357/80; 357/70; 174/52 FP; 339/17 CF
[58] Field of Search ............... 357/74, 75, 80, 70; 174/52 FP, 52 PE; 339/17 CF

[56] References Cited

U.S. PATENT DOCUMENTS

| | | | |
|---|---|---|---|
| 3,363,146 | 1/1968 | Dijkmeijer | 357/74 |
| 3,489,845 | 1/1970 | Landron | 357/74 |
| 3,549,784 | 12/1970 | Hargis | 357/74 |
| 3,588,618 | 6/1971 | Otte | 357/74 |
| 3,700,788 | 10/1972 | Spurck | 357/74 |
| 3,735,214 | 5/1973 | Renskers et al. | 357/74 |
| 3,781,457 | 12/1973 | McKerreghan | 357/74 |
| 3,789,341 | 1/1974 | Dalmasso | 357/74 |
| 3,815,077 | 6/1974 | Anhalt et al. | 357/74 |
| 3,912,984 | 10/1975 | Lockhart | 357/74 |
| 4,139,726 | 2/1979 | Penrod et al. | 357/74 |

*Primary Examiner*—Andrew J. James
*Attorney, Agent, or Firm*—Cruzan Alexander; Donald M. Sell; Robert L. Marben

[57] ABSTRACT

A leaded mounting and connector unit for an electronic device wherein the unit includes a structure having two parallel sides and a plurality of metallized areas which connect with spaced metallized areas provided at the parallel sides to which terminal leads are bonded. Grooves provided in the two sides receive the terminal leads which, in some cases, can extend beyond the sides serving to locate a cover or locate and connect with a leadless structure positioned above the leaded unit. The terminal leads are provided with tab members for locating the leads relative to the structure and to locate a leadless structure at a position above the leaded unit. In another arrangement, a leaded mounting and connector unit serves as a mother board on which one or more mounting and connector units are mounted at least on the bottom of the mother board with at least the mounting and connector unit mounted on the bottom of the mother board having protrusions or the cover for such units having protrusions which are received between the terminal leads for locating mounting and connector units relative to the mother board unit.

7 Claims, 11 Drawing Figures

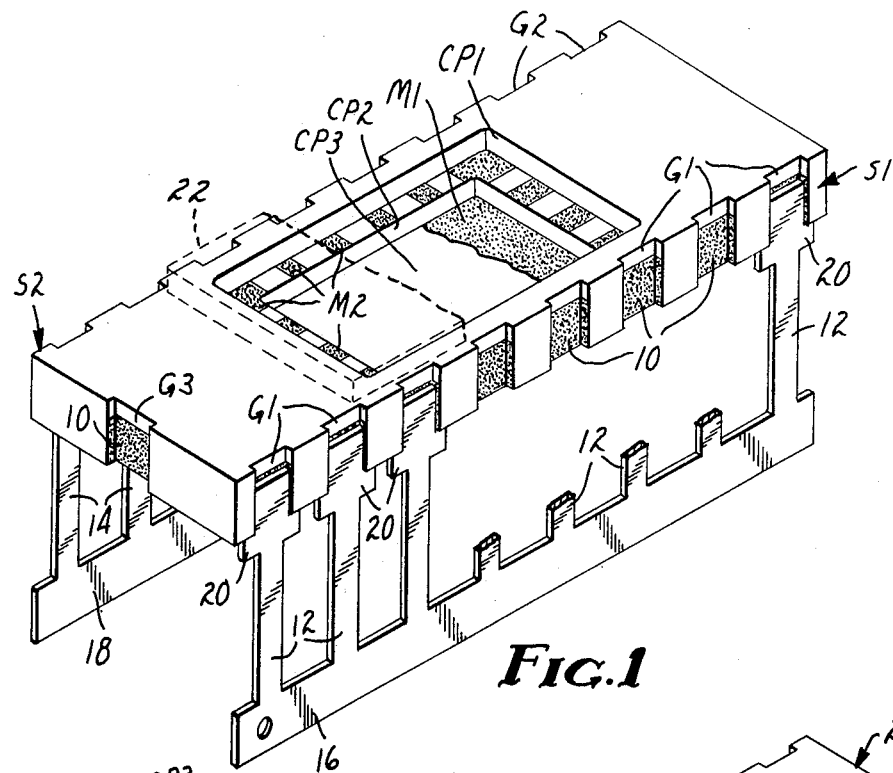
FIG.1
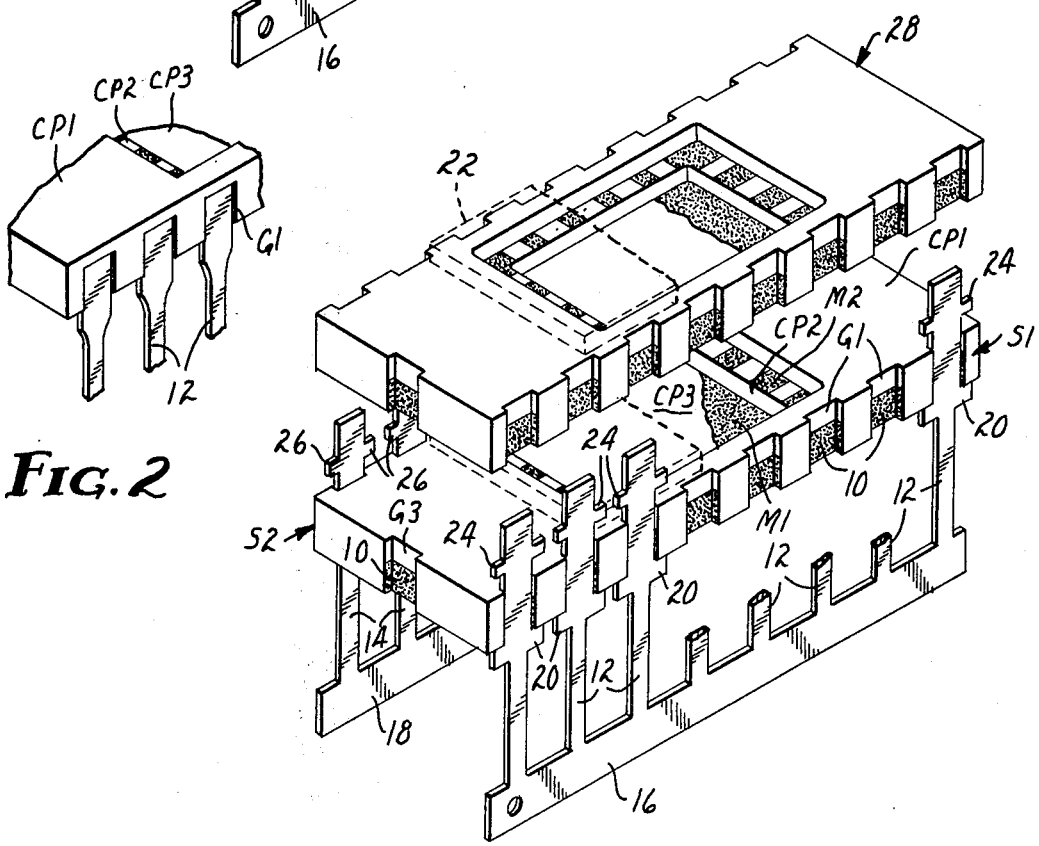
FIG.2
FIG.4

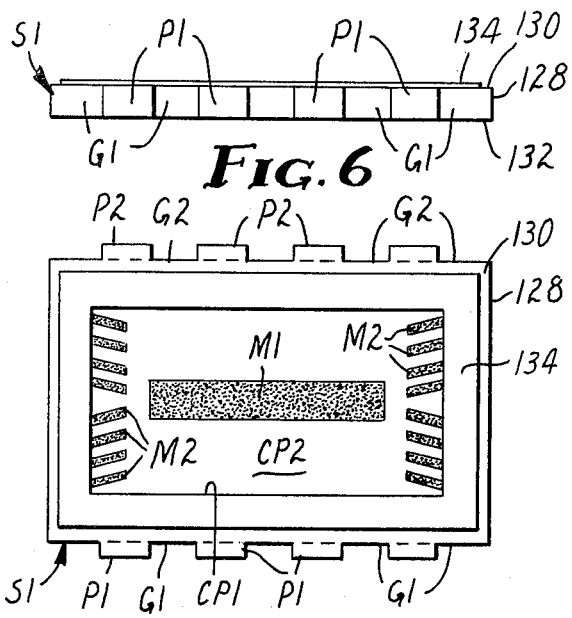
FIG. 6
FIG. 7
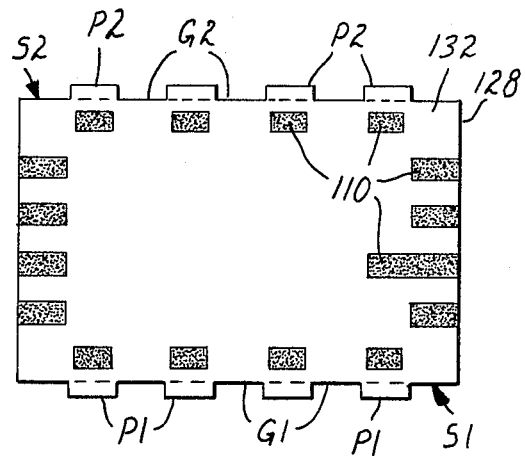
FIG. 8
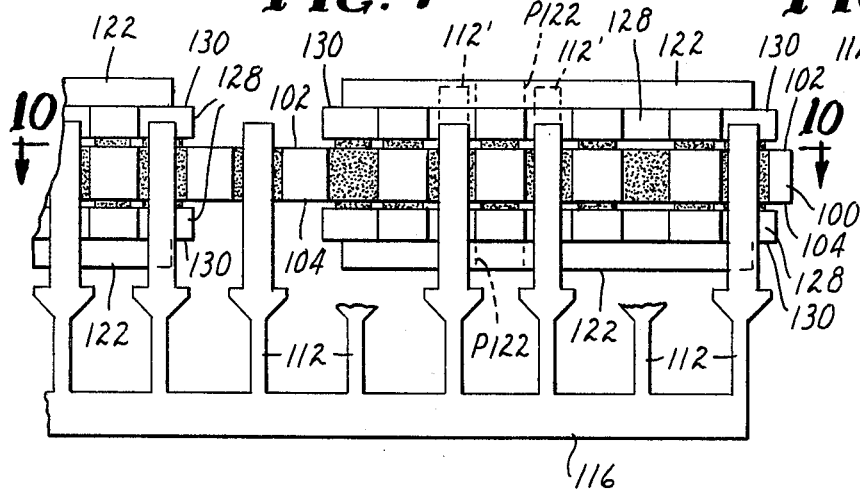
FIG. 9
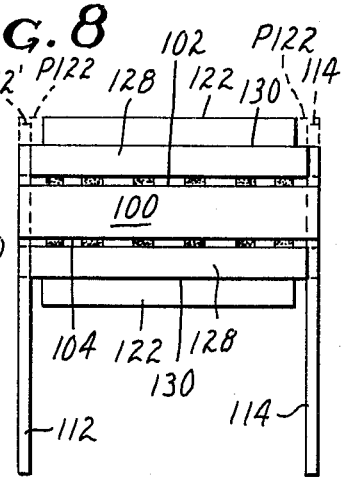
FIG. 11
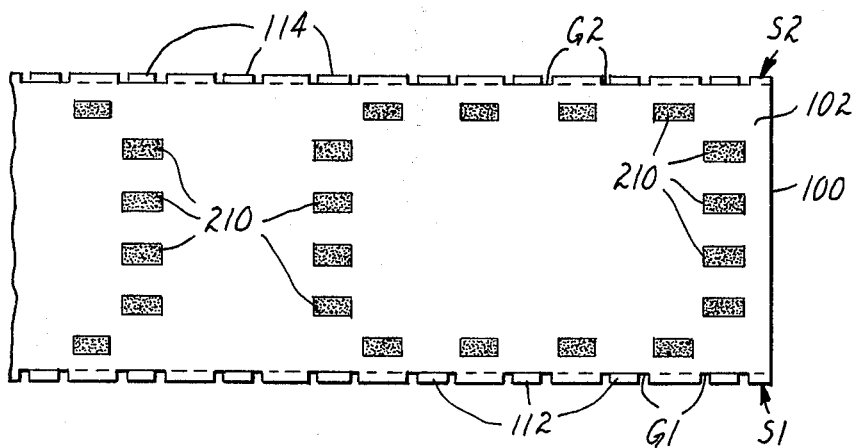
FIG. 10

LEADED MOUNTING AND CONNECTOR UNIT FOR AN ELECTRONIC DEVICE

This application is a continuation-in-part of application Ser. No. 932,609, filed Aug. 10, 1978.

BACKGROUND OF THE INVENTION

1. Field of the Invention

The invention relates to an improved leaded mounting and connector unit for an electronic device wherein the unit includes a structure having two parallel opposed sides and a plurality of metallized areas which connect with spaced metallized areas provided at the parallel sides to which terminal leads are bonded.

2. Description of the Prior Art

Leaded mounting and connector units for electronic devices are known which are formed from two or more sheets of ceramic particulate, hereinafter referred to as green ceramic sheets, wherein at least one of the sheets have metallized areas. A portion of the metallized areas, which are first plated so conductors can be bonded to it, are used for making connections with an electronic device(s) when it is mounted on the unit with such portions connecting with metallized portions that extend to various edge portions of the sheet. The metallized portions can be on one or more of the sheets. Prior to firing for densification of the sheets, selected spaced areas along the edges of some of the sheets are metallized to make electrical contact with selected metallized areas carried on the major surface of a ceramic green sheet which extend to the edge of the sheet. Such sheets are usually first superimposed on one another in a desired order and the selected edge portions then metallized. Any other additional green ceramic sheets required for the unit are then superimposed on the other sheets and the layered structure is laminated by pressure or pressure and heat prior to heating to densify the ceramic to form a monolithic structure. Leaded mounting and connector units of the type, commonly referred to as side brazed dual in-line units, have been made in this manner. The edge portions of the sheets that receive the metallization in such prior art units present essentially flat side walls. The edge metallized areas are spaced apart in accordance with industry standards. In order to provide improved braze wetting, the edge metallized areas are plated with an acceptable metal such as nickel. Terminal leads, which are secured together at one end by a tie bar, have a portion at the other end of each lead positioned opposite the end metallized areas when they are secured to the plated metallized portions by brazing. In order to maintain alignment of the leads with respect to the edge metallized portions and eliminate expensive brazing fixtures, the leads are formed from metals having essentially the same coefficient of expansion as the densified ceramic such as an iron-nickel-cobalt alloy known by the tradename "Kovar." Standardization of dual in-line units has required the placement and bonding of a set of terminal leads on one side directly opposite a set of leads bonded on the other side, with the same spacing between the leads of each set. Such placement is made at times by using cross tie bars which extend between the two sets of terminal leads.

The prior art structure presents problems with respect to the control of the width and placement of the edge metallization pattern and expensive lead frames or extensive braze fixtures are required to insure alignment of the leads to both the edge metallization areas and to the opposing row of leads. This makes the brazing operation for securing the terminal leads labor intensive, expensive and creates defects and reduce yields.

Further, such prior art leaded mounting and connector units for electronic devices have only limited circuit packaging density which is provided in those units where more than one electronic device may be mounted on a single unit.

SUMMARY OF THE INVENTION

The problem presented with respect to the prior art structure are solved by the present invention which provides an improved leaded mounting and connector unit for an electronic device or devices wherein the unit is one which is formed from at least two or more sheets of green ceramic that are laminated by pressure or pressure and heat and then fired to form a monolithic structure with at least one of the sheets having a plurality of metallized areas, the structure presenting two parallel opposed sides, each side having metallized areas to which terminal leads having a tie bar are bonded. An improvement resides in each of the two parallel sides having a plurality of grooves, which are preferably flat bottomed, which extend generally parallel to the sides and generally perpendicular to the sheets at which the metallized areas for the terminal leads are located. With this structure, the terminal leads can be of metal which does not have substantially the same coefficient of expansion as the sheet material. This provides a cost reduction in providing the terminal leads.

Another improvement resides in at least two of the terminal leads for each side having at least one tab member defining a width for the lead that exceeds the width of the groove receiving the lead, such tab member serving to position the leads lengthwise of the grooves.

An improvement serving to position the leads lengthwise of the grooves resides in the structure having grooves in the two parallel sides with the grooves closed at one end. The closed end of each groove serves to limit the portion of the terminal leads that can be received in the groove to aid in the placement of the terminal leads on the structure.

Another improvement resides in an embodiment wherein at least two of the terminal leads for each of two opposed grooved sides have an extended portion opposite the lead end which extends beyond the groove for the leads, two adjacent extended portions for each side, for example, being usable after an electronic device is mounted on the unit for locating a cover member for the electronic device, the cover member having protrusions keyed to two adjacent extended portions at each of the two opposed sides.

Another improvement resides in an embodiment wherein each terminal lead for the two opposed sides extends beyond both ends of the grooves for the terminals, each portion of a terminal extending beyond one end being usable as the male portion of a male-female connection with the terminal portions extending byeond the other end of the grooves being usable for locating and bonding the leads in electrical connection with one or more leadless units having two opposed sides with grooves corresponding to the grooves of the leaded unit. The latter portions of at least two of the terminal leads for each side have at least one tab member at one or more selected points along the leads to establish the spacing of a leadless unit or units from the leaded unit.

In an embodiment of a leaded mounting and connection unit wherein the unit includes a structure having two parallel opposed sides that are essentially flat to which the terminal leads are bonded to spaced metallized areas on the sides, an improvement resides wherein at least two terminal leads for each of the two parallel opposed sides each have an extended portion opposite the lead end, which extends beyond the structure, two adjacent extended portions for each side, for example, being usable after an electronic device is mounted on the unit for locating a cover member for the electronic device, the cover member having protrusions keyed to two adjacent extended portions at each of the two sides.

A further improvement resides in an embodiment of a leaded mounting and connection unit wherein the two parallel opposed sides provided by the structure are essentially flat with terminal leads bonded to spaced metallized areas on the two sides, each terminal lead having an extended portion opposite the lead end which extends beyond the structure which are usable for bonding to a metallized edge portion of one or more leadless units with at least two extended portions for each side having at least one locating tab member to establish the spacing of a leadless unit from the leaded unit wherein the leadless unit has sides with metallized grooves to which the terminal leads of the leaded unit can be bonded. By using tab members which are directed inwardly of the unit, the leadless unit can be of the type having flat sides to which the terminal leads of the leaded unit are bonded. With either arrangement, at least one tab member directed inwardly of the leaded unit for at least two of the terminal leads for each of the two sides can be used to position the structure for the leaded unit lengthwise of the terminal leads.

Another embodiment for a leaded mounting and connecting structure embodying the present invention which can provide high circuit packaging density includes a first mounting and connecting unit having a top and bottom surface and two parallel opposed sides which extend between the top and bottom surfaces, the bottom surface having at least one set of a plurality of metallized areas; a plurality of spaced metallized areas positioned on both of the two parallel sides and making connection with selected metallized areas of the one set of a plurality of metallized areas; a plurality of terminal leads, each of the terminal leads physically and electrically bonded to a different one of the spaced metallized areas and extending from the structure in a direction away from the bottom surface; a second mounting and connecting unit having a multi-level first surface and an opposed second surface, this second surface having a plurality of metallized areas corresponding to and physically and electrically connected to the one set of a plurality of metallized areas at the bottom surface of the first unit, the second mounting unit having two parallel opposed sides which connect between the first and second surfaces, each of the opposed sides having at least one locating protrusion, each protrusion received between two adjacent terminal leads of the plurality of terminal leads serving to locate the second mounting unit relative to said bottom surface of the first mounting unit prior to physical connection of the metallized areas on the bottom of the first unit to the metallized areas on the second surface of the second mounting unit.

Rather than having the locating protrusions carried by the second mounting unit, a cover, which is physically secured to the multi-level first surface of the second mounting unit, can provide the locating protrusions for locating the second mounting unit relative to the bottom surface of the first mounting unit prior to physical connection of the metallized areas on the bottom of the first unit to the metallized areas on the second surface of the second mounting unit.

Use of the second mounting unit makes it possible to mount an electronic device such as an integrated circuit chip at a surface of the multi-layered first surface of the second mounting unit which can then be checked for acceptability. The second mounting unit is then provided with a cover and is positioned relative to the terminal leads by the locating protrusions provided on either the cover or the second mounting unit. By providing one or more additional sets of a plurality of metallized areas at the bottom surface of the first mounting unit more than one of the second type of mounting units can be positioned at the bottom surface of the first mounting unit. The second mounting unit(s) can readily be held in place by positioning the terminal leads so they straddle a rod with the cover for the second mounting unit(s) in contact with the rod. With leading pointing downward, the first and second mounting units are held together by gravity allowing them to then be passed through a furnace to cause the metallized areas on the bottom of the first unit to be joined to the metallized areas on the second surface of the second mounting unit. By providing one or more sets of a plurality of metallized areas at the top surface of the first mounting unit corresponding to those provided at the bottom surface of the first unit, one or more mounting units similar to the second mounting unit can be positioned on and secured to the top surface of the first mounting unit via the metallized areas during the same pass through the furnace.

By extending at least two adjacent terminal leads on each of the opposed parallel sides of the first mounting unit beyond the top surface of the first mounting unit for each mounting unit to be provided at top surface of the first mounting unit, locating protrusions can be provided on the mounting unit(s) for the top surface of the first mounting unit to facilitate positioning of the mounting unit(s) for the top surface relative to the metallized areas at the top surface of the first mounting unit.

Rather than providing for the mounting of additional second mounting units for the top surface of the first mounting unit, metal heat sink can be secured to the top surface of the first mounting unit opposite each second mounting unit secured to the bottom surface of the first mounting unit.

The first mounting and connecting unit can have parallel sides, each of which define separate plane surfaces on which the spaced metallized areas are located to which the terminal leads are secured or the two parallel sides can be provided with a plurality of grooves which receive the metallized areas and in which the terminal leads are secured.

BRIEF DESCRIPTION OF THE DRAWINGS

The broad aspects of the invention having been described, the invention will be described in greater detail by reference to the drawings wherein:

FIG. 1 is a perspective view of one leaded mounting and connector unit embodying the present invention;

FIG. 2 is a partial perspective view depicting a modification of the unit shown in FIG. 1;

FIG. 4 is a perspective view of a leaded mounting and connector unit depicting a modification of the unit shown in FIG. 1 together with a leadless unit;

FIG. 6 is a side view of a sub-unit for the leaded mounting and connector unit shown in FIGS. 9–11;

FIG. 7 is the top view of the sub-unit of FIG. 6;

FIG. 8 is the bottom view of the sub-unit of FIG. 6;

FIG. 9 is the side view of a leaded mounting and connector structure embodying the invention which includes one or more of the sub-units of FIGS. 6–8;

FIG. 10 is a view of the structure of FIG. 9 taken along line 10—10; and

FIG. 11 is an end view of the structure of FIG. 9.

DETAILED DESCRIPTION

Figure 3:
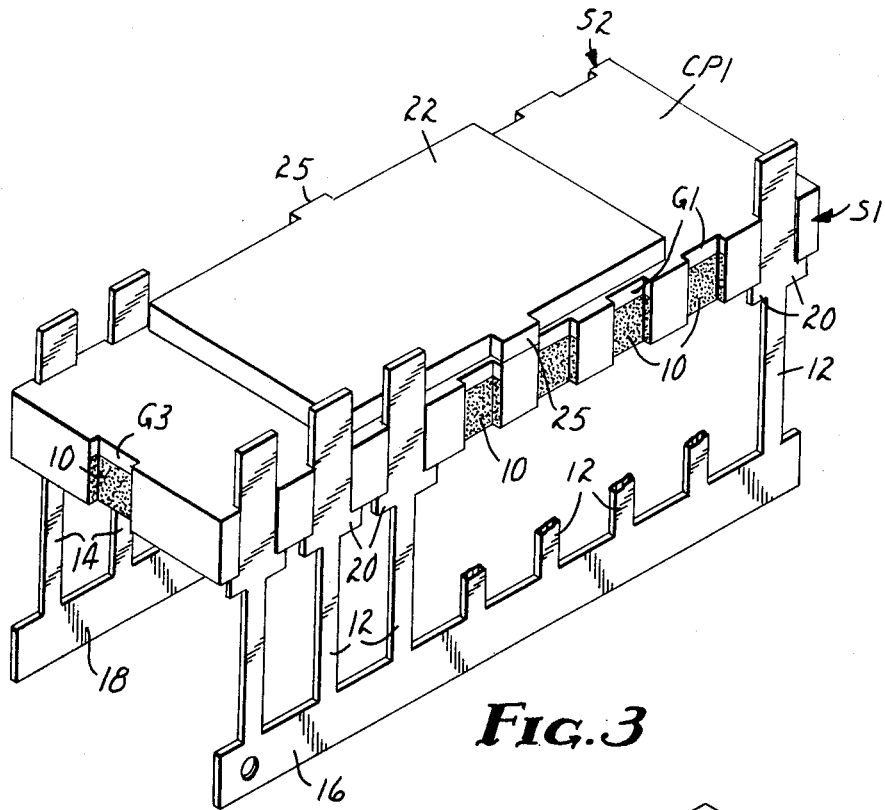
FIG. 3 is a perspective view of a leaded mounting and connector unit depicting a modification of the unit shown in FIG. 1 with a cover positioned on the unit.

Referring to FIG. 1, a leaded mounting and connection unit for an electronic device, particularly, an integrated semiconductor circuit that is contained in a single semiconductor chip, is illustrated which embodies the invention. The unit of FIG. 1 is formed from three layers CP1, CP2 and CP3 provided from three sheets of green ceramic material which, after having certain areas metallized, as will be discussed, are superimposed on one another, laminated by pressure or pressure and heat and are then densified by heating the layers to form a monolithic structure.

The layers or sheets CP1, CP2 and CP3 are formed from green ceramic material so their edges present two opposite sides S1 and S2 of the unit, which are castellated to provide a number of open-ended grooves G1 at side S1, which are preferably flat bottomed, with an equal number of similar grooves G2 at side S2, which are positioned directly opposite the grooves G1. The grooves extend the thickness of the three layers CP1, CP2 and CP3 and are generally parallel to the sides and perpendicular to the plane upper surface of layer CP1. Grooves similar to grooves G1 and G2 can also be provided in the sides connecting sides S1 and S2, if required. This is illustrated by the groove G3.

The upper layer CP1 is formed with a generally central opening which, in FIG. 1, is illustrated as rectangular in form, with a similarly shaped, but smaller, opening in the adjoining layer CP2, allowing the inner peripheral portion of the layer CP2 at its central opening to remain exposed when layer CP1 is positioned on layer CP2.

The upper central exposed area of the lower layer CP3 is usually metallized to include the entire exposed areas. Metallizing materials and its application to selected areas of green ceramic is well known in the art. Such metallization is only shown in part by the portion indicated at M1. Selected portions of the upper surface of layer CP2 are also metallized as indicated at M2. The metallized areas M2 are placed on the layer CP2 before layer CP1 is placed in position over layer CP2. Though not shown in FIG. 1, the metallized areas M2 form discrete conductive paths which extend to the edge of layer CP2 at the various grooves G1, G2 and G3, as required. Following densification of the superimposed green ceramic layers CP1, CP2 and CP3, the exposed portions of the metallized areas M1 and M2 are usually nickel plated and then silver or gold plated.

The surface of the portion of grooves G1, G2 and G3 formed when layer CP2 is superimposed on layer CP3 are metallized as indicated at 10 to complete an electrical path from each groove to any metallized portion M2 that extends to the edge portion of layer CP2 defining the grooves. The metallized areas 10 of the grooves, which can include the sides of the grooves, are plated with a suitable metal such as nickel. The metal used for plating of the metallized areas 10 serves to improve braze wetting, which is desirable, since the terminal leads 12 and 14, which are disposed in grooves G1 and G2, respectively, are normally physically and electrically bonded to metallized areas 10 provided in the grooves by brazing.

The grooves G1 and G2 serve to accurately locate the metallized areas 10 needed on sides S1 and S2 and simplify the positioning of the terminal leads 12 and 14 opposite the metallized areas. For ease of handling, the terminal leads 12, when formed, are joined at one end by a tie bar 16 with a tie bar 18 similarly provided for terminal leads 14. The other ends of the leads 12 and 14 are received in the grooves G1 and G2, respectively.

The grooves G1 and G2 also serve to confine the leads 12 and 14 during the brazing operation required to braze the leads 12 and 14 to the metalized areas 10 in the grooves. This confinement of the leads in position enables the leads 12 and 14 to be formed from metals which do not have essentially the same coefficient of expansion as the ceramic material for layers CP1, CP2 and CP3. Such metals as iron, nickel, copper, or alloys thereof, for example, are suitable. When the leads 12 and 14 are brazed to metallized areas along a side that does not have grooves, it is necessary, in the absence of special jigs for maintaining the leads in position, that the lead terminals be made of metal which has a coefficient of expansion that is essentially the same as the ceramic, such as an iron-nickel-cobalt alloy known by the tradename "Kovar."

Another feature provided by the terminal leads 12 is the tab members 20 which extend outwardly from opposite sides of the leads in a plane that is parallel to the sides S1 and S2 of the unit. These tabs serve to determine the extent to which the terminal leads 12 are extended into the grooves G1 to simplify the assembly and brazing procedure by reducing the need for expensive assembly jigs or fixtures. Similar tabs (not shown) are also provided on the terminal leads 14.

FIG. 2 shows a portion of the structure of FIG. 1 illustrating an alternative arrangement for the positioning of the terminal leads 12 and 14 in the grooves. Layer CPT is extended to close off one end of the grooves G1 and G2. The layer CP1 then serves as a stop for the terminal leads 12 and 14 and eliminates the need for the tabs 20 on the leads 12, as well as the similar tabs on leads 14 (not shown).

Referring once again to FIG. 1, it will be noted that a cover 22 indicated by the dotted line outline is shown. A cover is applied to a leaded mounting and connector unit after an electronic device (not shown) has been mounted on layer CP3 of the unit within the central recess area provided by the layers CP1 and CP2 and conductors (not shown) bonded to the appropriate points of the device and the various metallized areas M2. FIG. 3 shows a portion of the structure of FIG. 2 which is modified by the use of leads 12 and 14, each having a portion that extends for a short distance above the upper surface defined by the layer CP1. A cover 22 of non-conductive material is also shown in position having protrusions 25, one for each of two opposite sides of the cover adjacent sides S1 and S2 of the unit. The protrusions 25 extend generally perpendicular to the sides of the cover and in the direction of the plane defined by the upper surface of the cover. The cover is positioned on the layer CP1 with one of the protrusions 25 presented between the extended portions of two adjacent terminal leads 12 and with the other protrusion 25 presented between two adjacent terminal leads 14 to key the cover in position to provide accurate placement of the cover 22 on layer CP1. The cover 22 is permanently positioned in place by a suitable manner such as a glass or adhesive seal provided at the peripheral edge of the cover that is in contact with layer CP1.

Referring to FIG. 4, another modification of the arrangement of FIG. 1 is shown wherein the terminal leads 12 and 14 extend beyond the upper surface of the layer CP1 and at a greater distance than is the case for the arrangement shown in FIG. 3 with tabs 24, which extend from opposite side edges of terminal leads 12, provided on each of the upwardly extended portions of terminal leads 12 at a point above the layer CP1. The tabs 24 are similar to the tabs 20. Similar tabs 26 are provided on each of the terminal leads 14 at the same point on the upwardly extended portions of terminal leads 14.

A leadless mounting and connector unit for electronic devices similar to the ceramic structure portion of the leaded unit described in connection with FIG. 1 is shown at 28 in FIG. 4 to illustrate the use of the leadless unit shown in FIG. 4. The leadless unit 28 can be placed so the upwardly extended portions of the terminal leads 12 and 14 are received in the grooves provided in the unit 28 with the protrusions which define the grooves in the unit 28 resting on the tabs 24 and 26 to position the unit 28 above the lower leads unit. The portion of the terminal leads 12 and 14 positioned in the grooves in unit 28 can then be soldered to the plated metallized portion of the grooves of unit 28. While not shown, an electronic device would first be mounted on the lower leaded unit and an electronic device (not shown) could be mounted on the unit 28 either before or after it is secured to the terminal leads 12 and 14.

Figure 5:
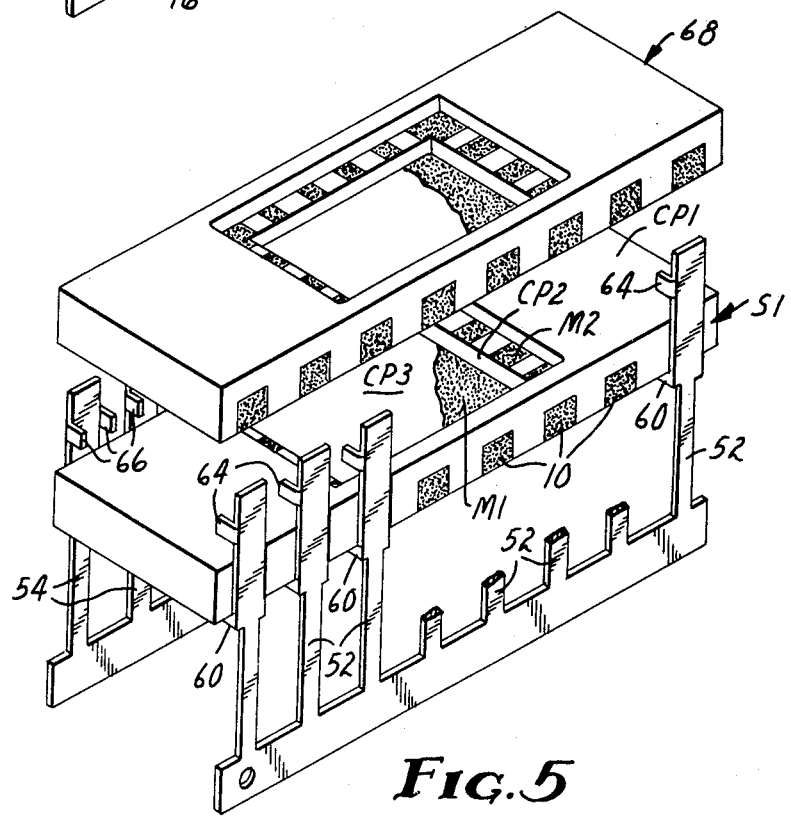
FIG. 5 is a perspective view of a leaded mounting and connector unit depicting a modification of the unit shown in FIG. 4 together with a modified showing of the leadless unit of FIG. 4.

While the stacking of one or more leadless units with a leaded unit, as described in connection with FIG. 4, requires units in which the terminal leads are positioned in grooves, FIG. 5 shows an alternative ceramic structure for the leaded unit wherein the layers CP1, CP2 and CP3 are formed with straight edges to present two opposite sides S1 and S2 of the unit which are flat and have plated metallized areas 10, corresponding to the plated metallized areas of the structure shown in FIG. 1, placed on the flat surface presented by sides S1 and S2. Terminal leads 52 and 54 are provided which correspond to terminal leads 12 and 14 of FIG. 4 are bonded by brazing to the plated metallized areas 10 on the sides S1 and S2 and are similarly structured, except that tabs 60 and 64 for terminal leads 52, which correspond to tabs 20 and 24, respectively, of terminal leads 12 and tabs 66, which correspond to tabs 26 of terminal leads 14, are turned inwardly of the unit. The terminal leads 54 also have tabs (not shown) which correspond to tabs 60 of terminal leads 52. The tabs 60 of terminal leads 52 and the corresponding tabs (not shown) on terminal leads 54 rest on the bottom of the unit provided by layer CP1 and serve to help position the terminal leads 52 and 54 relative to the sides S1 and S2. The tabs 64 and 66 are used to receive and position a unit 68 relative to the upwardly extending portions of terminal leads 52 and 54 to position the unit 68 above the lower leaded unit. The unit 68 is similar to the leaded unit described in connection with FIG. 5 and presents flat opposed sides at which plated metallized areas are presented and positioned opposite the terminal leads 52 and 54 to which the terminal leads are bonded in a suitable manner, such as by soldering. Electronic devices (not shown) would be mounted in a manner similar to that described in connection with the arrangement shown in FIG. 4.

In view of the description given with respect to FIG. 4 setting forth the function of tab members 24 and 26 for positioning a grooved leadless unit 28 above the leaded unit, it can be appreciated that the tab members 64 and 66 described for the terminal leads 52 and 54, respectively, in FIG. 5 can be of the same form as tab members 24 and 26 in which case a grooved leadless unit can be positioned above the flat sided leaded unit of FIG. 5. Similarly, the tab members 24 and 26 for terminal leads 12 and 14 of FIG. 4 could take on the form for the tab members 64 and 66 for the terminal lead structure of FIG. 5 allowing a leadless unit having two flat parallel opposed sides rather than grooved sides to be positioned above the grooved leaded unit of FIG. 4.

Another embodiment of the invention is shown in FIGS. 9-11 of the drawings. The structure shown includes a first mounting and connecting unit 100, which serves as a "mother board" for a plurality of second mounting and connecting units 128 that are physically and electrically connected to the unit 100. The unit 100 has a top surface 102 and a bottom surface 104 at which the units 128 can be placed. Four of the second mounting and connecting units 128 are shown in the structure of FIGS. 9-11. The second mounting and connecting unit 128 is particularly useful, as will be explained, when it is desired that one or more electronic devices be located at the bottom side of the structure. Each of the units 128 have a cover 122 that is secured, as will be explained, to a peripheral portion of the outer surface portion of a multi-level first surface 130 of unit 128.

The second mounting and connecting unit 128 is shown in greater detail in FIGS. 6-8 to which an electronic device, particularly, an integrated semiconductor circuit obtained in a single semiconductor chip (not shown) can be mounted. The unit 128 is a leadless mounting and connecting unit and is similar to the ceramic structure portion of the leaded unit described in connection with FIG. 1, except that the layer CP3 is not required and the plurality of metallized areas 10 provided at the two opposite sides S1 and S2 of the ceramic structure portion of FIG. 1 are not used. In addition, the layer CP2 does not have the central opening shown in FIG. 1. To the extent that like or equivalent elements are present in the ceramic structure of FIG. 1 and the unit shown in FIGS. 6-8, like references have been used to identify such elements. The metallized area M1 is provided on the layer CP2 along with the metallized areas M2. Connections (not shown) with the metallized area M1 and the metallized areas M2 provided at the layer CP2 of multi-level first surface 130 are made as required to the plurality of metallized areas 110 provided at the opposed second surface 132 of the unit 128. The manner in which this can be accomplished is well known. The leadless unit 128 has two parallel opposed sides S1 and S2 which extend between the surfaces 130 and 132. While a number of protrusions P1 and P2 are provided at the sides S1 and S2, respectively, it is only necessary for this embodiment that only one of each of the protrusions P1 and P2 be provided on the unit 128, since they are not provided to define the grooves G1 and G2, which, in the case of the structure of FIG. 1, receive the terminal leads 12. The protrusions P1 and P2 are provided in this embodiment as locating protrusions which serve to locate the unit 128 relative to first mounting and connecting unit 100 and, particularly, in connection with location of a unit 128 at the bottom surface 131 of the first unit 100. A closed band 134 of sealing material, such as an adhesive or glass is provided at an outer peripheral portion of the surface 130 to secure a cover 122 to the unit 128 after an electronic device, such as an integrated circuit chip (not shown) has been electrically and physically secured to the metallized area M1 and the necessary electrical connections have been made between the device and the appropriate metallized areas M2. After the electronic device has been mounted and connected to the unit 128, an integrity check can be made of the unit 128 and device via the metallized areas 110 at the surface 132 of the unit prior to mounting and electrically connecting to the first mounting and connecting unit 100.

Referring to FIG. 10, the unit 100 has metallized areas 210 located on the top surface 102 which are positioned to mate with the metallized area 110 of the unit 128 where the unit 128 is positioned at the surface 102. Two sets of metallized areas 210 are shown on the top surface 102 of unit 100. It would be possible to add additional sets, if desired. In addition, two sets of metallized areas, such as the areas 210, are also located on the bottom surface 104 of unit 100. FIG. 10 is, therefore, also a representation of the bottom surface 104 of unit 100.

With top and bottom surfaces 102 and 104 as just described, the remainder of the unit 100 is similar to the leaded mounting and connecting unit shown in FIG. 1 in that two parallel opposed sides S1 and S2, which connect the surfaces 102 and 104, are provided which are castellated to provide a number of open-ended grooves G1 at side S1 with a like number of similar grooves G2 provided at side S2 opposite the grooves G1. The bottom of each of the grooves are preferably flat-bottomed and are metallized. As in the case of the leaded mounting and connecting unit shown in FIG. 1, the grooves G1 and G2 serve to accurately locate the metallized areas needed on sides S1 and S2, which are electrically connected with the metallized areas at the top and bottom surfaces 102 and 104. In addition, the grooves G1 and G2 simplify the positioning of terminal leads 112 and 114, similar to the leads 12 and 14 of FIG. 1, opposite the metallized areas. For ease of handling, the terminal leads 112, when formed, are joined at one end by a tie bar 116. The terminal leads 114 are also formed with a tie bar (not shown). The terminal leads are positioned within the grooves G1 and G2 so that an end portion of the leads extends above top surface 102 of the unit 100 serving to receive the protrusions P1 and P2 of a unit 128 between adjacent terminal leads to aid in the positioning of a unit 128 at the top surface 102.

The grooves G1 and G2 of unit 100, as in the case of the FIG. 1 structure, serve to confine the leads 112 and 114 during the brazing operation required to braze the leads 112 and 114 to the metallized areas at the grooves. It should be noted that unlike the terminal leads 12 and 14 of the structure of FIG. 1, the terminal leads 112 and 114 do not have the tabs 20, since the use of such tabs for the unit 100 would interfere with the positioning of the unit 128 at the bottom surface 104 of unit 100, since the protrusions P1 and P2 of unit 128 are received between adjacent terminal leads 112 and 114.

Since the unit 128 is supplied with a cover 122 which is secured to the surface 130 of unit 128 after an electronic device has been mounted on and connected to the unit 128, the groove G1, G2 and protrusions P1 and P2 at the sides S1 and S2 on the unit 128 can be eliminated. The dotted lines shown at the sides S1 and S2 of the unit 128 in FIGS. 7 and 8 are used to indicate this alternative structure. In this case, the cover 122 is provided with a protrusion P122, shown in dotted line form, on each side of the cover adjacent the lead terminals 112, 114 and two of the lead terminals 112 and 114 are extended, as indicated by the dotted line form 112' and 114', to receive the protrusions P122. In addition, the remaining terminal leads 112 and 114 need not extend above the top surface 102 of unit 100 allowing the terminal leads 112 and 114, except 112' and 114', to be received in grooves at S1 and S2 that are closed at one end as shown in FIG. 2. As indicated in connection with FIG. 2, the close ended grooves facilitate the positioning of the terminal leads at the grooves. Only one of the lead terminals 112 and one of the lead terminals 114 need be extended as indicated above if two protrusions P122 are provided at one side of the cover 122 for receiving the extended lead 112 between them with two protrusions P122 provided at the opposite side of the cover 122 for receiving the extended lead 114 between them.

While it is convenient and useful to use a structure for unit 100 with castellated sides S1 and S2, it can be appreciated that the feature of using protrusions on the unit 128 for locating the units 128 on unit 100 as described for the structure shown in FIGS. 7-11 can also be used wherein the unit 100 has sides S1 and S2 which are not castellated at which the terminal leads 112 and 114 are secured. This modification is illustrated by sides S1 and S2 in FIG. 10, wherein a dotted line is used to indicate that the sides S1 and S2 can be straight rather than castellated.

While no mention was made of plating being provided at portions of the various metallized areas, it should be understood that it is well known and normal procedure in making devices of this type that portions of the metallized areas be plated with a metal, such as nickel, silver, tin or gold, or be screen printed with a brazing material, such as copper-silver paste, to provide the necessary basis for making connections between the mounting units and the electronic device to be mounted and connected to the units 128, as well as for bonding the lead terminals 112 and 114 to the metallized areas in the grooves G1 and G2 of the unit 100 and for completing the bonding connection between the metallized areas 110 of unit 128 and the corresponding metallized areas 210 of unit 100. It should be noted in connection with FIG. 9 that the units 128 are spaced slightly from the unit 100 except where the electrical contact between the areas 110 and 210 are made. This is accomplished by the use of sufficient soldering material or by use of raised bumps at the metallized areas 110 and 220. This spacing, though not required, is desirable since it allows the flux to be washed away after the brazing operation for securing the units 128 to the units 100 is completed.

As a modification to the embodiment of FIGS. 6–11, a structure of the type described in connection with FIGS. 6–11 can be provided wherein only the bottom surface of the mounting and connecting unit 100 is used to receive one or more mounting and connecting units 128. In such an arrangement, the metallized areas 210 at the upper surface 102 would not be provided. This makes it possible, when desired, to mount a piece of metal at the upper surface 102 opposite each unit 128 mounted at the bottom surface 104 of the unit to serve as a heat sink for the electronic device mounted on the unit 128.

While mounting units having a structure formed from a number of layers of green ceramic has been described, structures formed from a different number of layers can be utilized with the mounting arrangements for the various terminal leads as described for the several embodiments in the drawings. Further, the invention presented herein is not limited to the specific form presented with respect to the various metallized areas provided on the layers as shown from which the ceramic structures are formed. The description given with respect to the metallized areas was only representative of one type of arrangement for the metallized areas that can be used and many others can be found in the prior art to which the invention presented herein is applicable.

What is claimed is:

1. A leaded mounting and connector structure including a first mounting and connecting unit having a top and bottom surface and two parallel opposed sides extending between said top and bottom surfaces, at least one set of a plurality of metallized areas at said bottom surface, a plurality of spaced metallized areas positioned on each of said two parallel opposed sides and connecting with selected metallized areas of said one set of a plurality of metallized areas, a plurality of terminal leads, each physically and electrically bonded to a different one of said spaced metallized areas and extending from said first unit in a direction away from said bottom surface; a second mounting and connector unit having a multi-level first surface and an opposed second surface, said second surface having a plurality of metallized areas corresponding to and physically and electrically bonded to said one set of a plurality of metallized areas at said bottom surface of said first unit, said second unit having two parallel opposed sides extending between said first and second surfaces, each of said last-mentioned opposed sides having at least one locating protrusion received between two adjacent terminal leads of said plurality of terminal leads serving to locate said second unit relative to said bottom surface of said first unit prior to physical bonding of said metallized areas at said bottom surface of said first unit to said metallized areas at said second surface of said second unit.

2. A leading mounting and connecting structure according to claim 1 wherein said second unit includes a plurality of metallized areas at said first surface electrically connected to selected metallized areas of said metallized areas at said second surface of said second unit.

3. A leaded mounting and connecting structure according to claim 1 wherein at least one set of a plurality of metallized areas is provided at said top surface of said first unit and connect with selected ones of said spaced metallized areas at said two opposed sides of said first unit with a third mounting and connecting unit included in said structure, said third unit having a multi-level first surface and an opposed second surface with a plurality of metallized areas at said last-mentioned second surface which correspond to and are physically and electrically connected to said one set of a plurality of metallized areas at said top surface of said first unit.

4. A leaded mounting and connecting structure according to claim 3 wherein at least two adjacent terminal leads of said plurality of terminal leads at each of said opposed sides of said first unit have a portion that extends beyond said top surface of said first unit and said third unit having two parallel opposed sides which extend between said first and second surfaces of said third unit with a locating protrusion provided at each of said two opposed sides of said third unit, said locating protrusions positioned between said portion of said two adjacent terminal leads at each of said opposed sides of said first unit which extend beyond said top surface of said first unit.

5. A leaded mounting and connector structure according to claim 1 wherein two parallel opposed sides of said first unit have a plurality of grooves with one of said plurality of spaced metallized areas positioned in a separate one of said grooves.

6. A leaded mounting and connector structure including a first mounting and connecting unit having a top and bottom surface and two parallel opposed sides extending between said top and bottom surfaces, at least one set of a plurality of metallized areas at said bottom surface, a plurality of spaced metallized areas positioned on each of said two parallel opposed sides and connecting with selected metallized areas of said one set of a plurality of metallized areas, a plurality of terminal leads, each physically and electrically bonded to a different one of said spaced metallized areas and extending from said first unit in a direction away from said bottom surface, a second mounting and connecting unit havng a multi-level first surface and an opposed second surface, said second surface having a plurality of metallized areas corresponding to and physically and electrically bonded to said one set of a plurality of metallized areas at said bottom surface of said first unit, said second unit having two parallel opposed sides extending between said first and second surfaces, a cover member secured to said first surface of said second unit and having at least two protrusions extending beyond said two parallel opposed sides of said second unit serving to locate said second unit relative to said bottom surface of said first unit prior to physical bonding of said metallized areas at said bottom surface of said first unit to said metallized areas at said second surface of said first unit, one of said protrusions received between two adjacent ones of said terminal leads at one of said two opposed sides of said first unit and another of said protrusions received between two adjacent ones of said terminal leads at the other of said two opposed sides of said first unit.

7. A leaded mounting and connector structure according to claim 6 wherein said two parallel opposed sides of said first unit having a plurality of grooves with one of said plurality of spaced metallized areas positioned in a separate one of said grooves.

* * * * *

UNITED STATES PATENT AND TRADEMARK OFFICE
CERTIFICATE OF CORRECTION

PATENT NO. : 4,271,426
DATED : June 2, 1981
INVENTOR(S) : BILLY M. HARGIS

It is certified that error appears in the above-identified patent and that said Letters Patent are hereby corrected as shown below:

Column 1, Line 50, "end" second occurrence should read --edge--.

Column 2, Line 4, "and" second occurrence should read --that--.

Column 5, Line 57 "areas" should read --area--.

Column 7, Line 38, "leads" should read --leaded--.

Column 8, Line 46, "obtained" should read --contained--.

Column 11, Line 52, "leading" should read --leaded--.

Column 12, Line 22, after "wherein" insert --said--.

Signed and Sealed this

Thirteenth Day of October 1981

[SEAL]

Attest:

Attesting Officer

GERALD J. MOSSINGHOFF
Commissioner of Patents and Trademarks